(12) United States Patent
Beerwerth et al.

(10) Patent No.: US 7,040,925 B2
(45) Date of Patent: May 9, 2006

(54) ELECTRICAL SOCKET

(75) Inventors: Wolfgang Beerwerth, Steinenbronn (DE); Gerd Philipp, Boeblingen (DE)

(73) Assignee: Telegaertner Karl Gaertner GmbH, Steinenbronn (DE)

( * ) Notice: Subject to any disclaimer, the term of this patent is extended or adjusted under 35 U.S.C. 154(b) by 0 days.

(21) Appl. No.: 11/071,058

(22) Filed: Mar. 2, 2005

(65) Prior Publication Data

US 2005/0176302 A1 Aug. 11, 2005

Related U.S. Application Data

(63) Continuation of application No. PCT/EP03/08577, filed on Aug. 2, 2003.

(30) Foreign Application Priority Data

Sep. 4, 2002 (DE) ................................ 102 42 143

(51) Int. Cl.
*H01R 13/66* (2006.01)
(52) U.S. Cl. ...................... 439/620; 439/941
(58) Field of Classification Search ................ 439/620, 439/676, 941
See application file for complete search history.

(56) References Cited

U.S. PATENT DOCUMENTS

| | | | |
|---|---|---|---|
| 4,553,111 A | | 11/1985 | Barrow |
| 4,560,962 A | * | 12/1985 | Barrow .......................... 333/1 |
| 4,935,093 A | * | 6/1990 | Reeb ............................. 216/6 |
| 5,186,647 A | | 2/1993 | Denkmann et al. |
| 5,295,869 A | | 3/1994 | Siemon et al. |
| 5,299,956 A | * | 4/1994 | Brownell et al. ........... 439/638 |
| 5,310,363 A | | 5/1994 | Brownell et al. |
| 5,326,284 A | | 7/1994 | Bohbot et al. |
| 5,362,257 A | | 11/1994 | Neal et al. |
| 5,391,095 A | * | 2/1995 | Born .......................... 439/676 |
| 5,414,393 A | | 5/1995 | Rose et al. |

(Continued)

FOREIGN PATENT DOCUMENTS

DE 196 49 668 5/1998

(Continued)

*Primary Examiner*—Renee Luebke
*Assistant Examiner*—Vanessa Girardi
(74) *Attorney, Agent, or Firm*—Lipsitz & McAllister, LLC

(57) ABSTRACT

The invention relates to an electrical socket with a housing, which has a space for inserting a connector and surrounds a contact module which comprises a number of electrical conductors and contact elements which can be contacted by associated plug contacts of the connector, two conductors respectively forming a pair of conductors. To develop the electrical socket in such a way that it can be produced at low cost and the risk of signal coupling between different pairs of conductors is reduced, it is proposed according to the invention that the contact module comprises a multi-layer circuit board which has compensation capacitors for the capacitive coupling of conductors of different pairs of conductors and means for inductive counter-coupling, in that at least the conductors of two pairs of conductors form conductor tracks in such a way that, in a first conductor track section, the distance of a first conductor track of the first pair of conductors from the first conductor track of the second pair of conductors is less than the distance from the second conductor track of the second pair of conductors, whereas, in the second conductor track section, the distance of the first conductor track of the first pair of conductors from the second conductor track of the second pair of conductors is less than from the first conductor track of the second pair of conductors.

24 Claims, 5 Drawing Sheets

U.S. PATENT DOCUMENTS

| | | |
|---|---|---|
| 5,432,484 A | 7/1995 | Klas et al. |
| 5,435,752 A | 7/1995 | Siemon et al. |
| 5,488,201 A | 1/1996 | Liu |
| 5,586,914 A | 12/1996 | Foster, Jr., et al. |
| 5,647,767 A | 7/1997 | Scheer et al. |
| 5,700,167 A | 12/1997 | Pharney et al. |
| 5,941,734 A | 8/1999 | Ikeda et al. |
| 5,967,853 A | 10/1999 | Hashim |
| 6,089,923 A | 7/2000 | Phommachanh ............ 439/676 |
| 6,157,542 A | 12/2000 | Wu |
| 6,305,950 B1 * | 10/2001 | Doorhy ..................... 439/76.1 |
| 6,333,472 B1 | 12/2001 | Weatherley |
| 6,464,541 B1 | 10/2002 | Hashim et al. |
| 6,520,808 B1 * | 2/2003 | Forbes et al. ............... 439/676 |
| 6,840,779 B1 | 1/2005 | Eberle et al. |
| 2003/0171024 A1 | 9/2003 | Mossner et al. |

FOREIGN PATENT DOCUMENTS

| | | |
|---|---|---|
| DE | 199 38 367 | 3/2001 |
| DE | 100 51 097 | 3/2002 |
| EP | 0 982 815 | 3/2000 |
| EP | 1 096 620 | 5/2001 |
| WO | 02/17442 | 2/2002 |

* cited by examiner

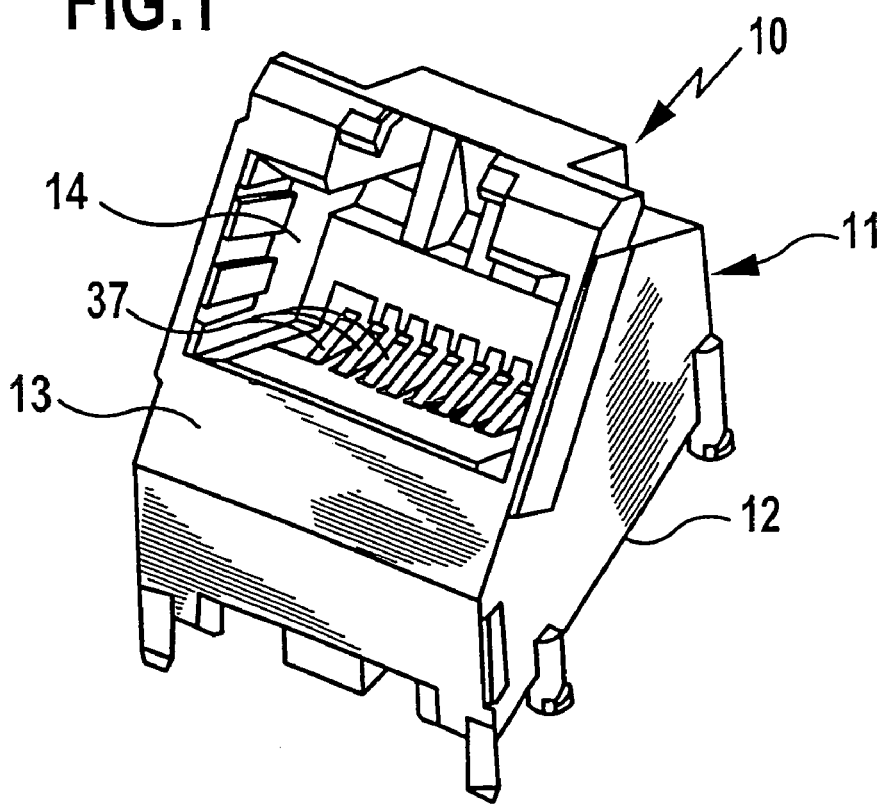
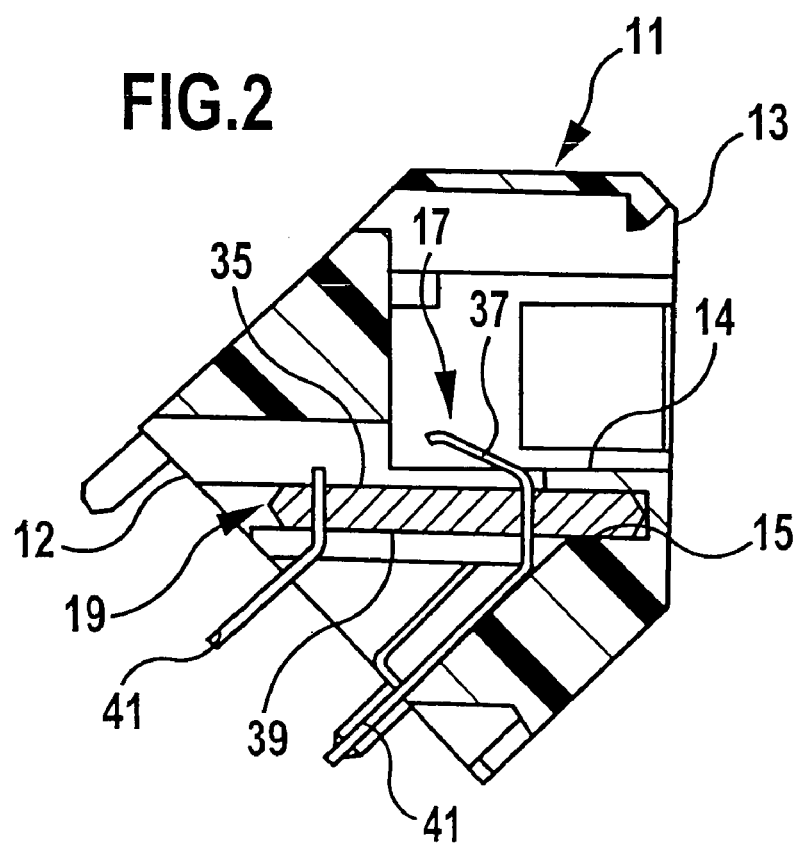

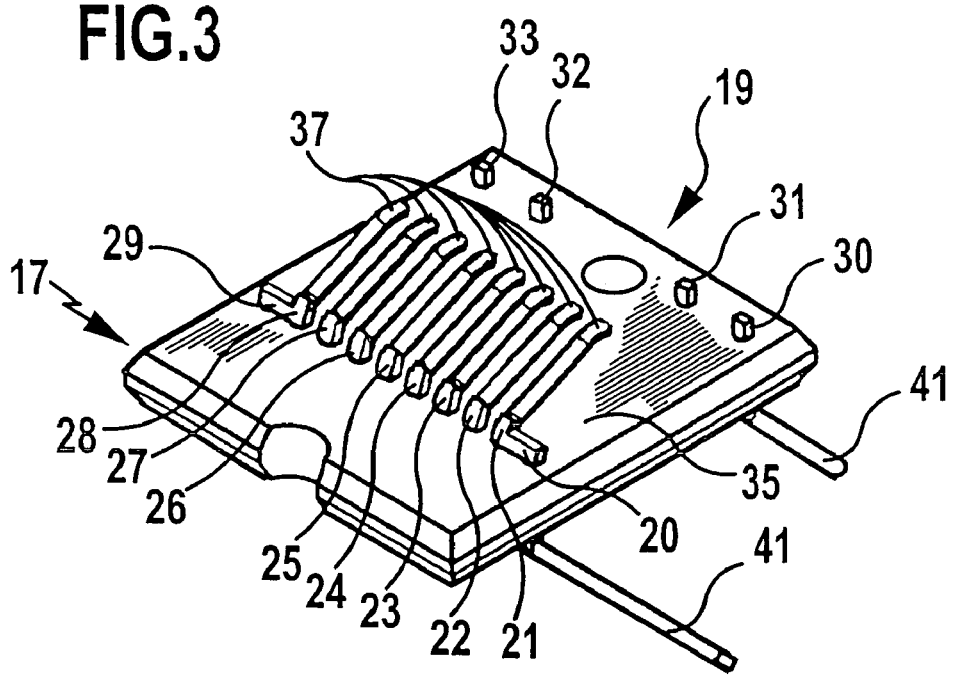
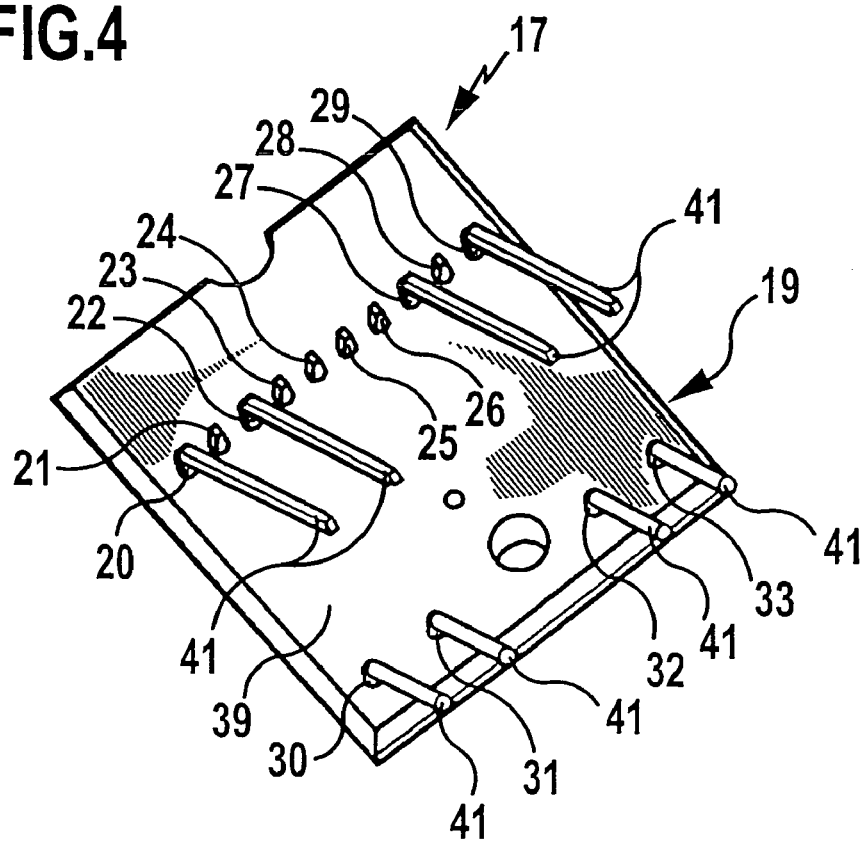

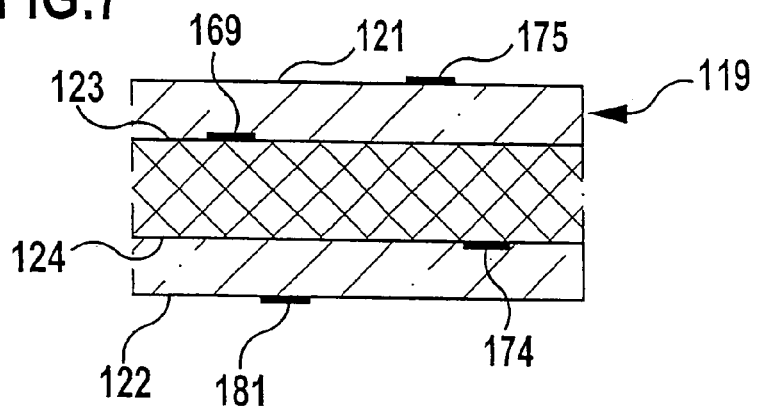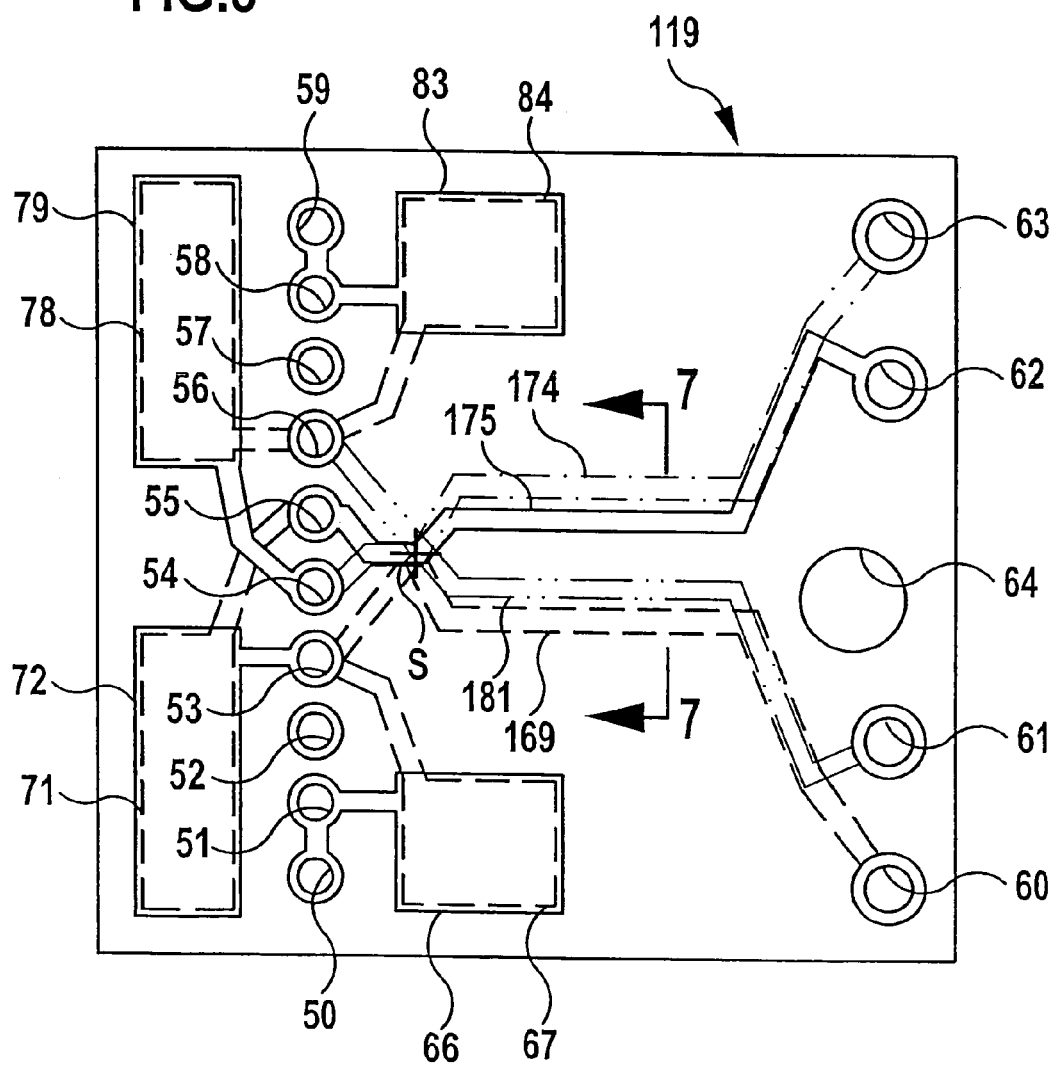

ELECTRICAL SOCKET

This application is a continuation of international application number PCT/EP2003/008577 filed on Aug. 2, 2003.

The present disclosure relates to the subject matter disclosed in international application number PCT/EP2003/008577 of Aug. 2, 2003 and German application number 102 42 143.9 of Sep. 4, 2002, which are incorporated herein by reference in their entirety and for all purposes.

BACKGROUND OF THE INVENTION

The invention relates to an electrical socket with the features of the preamble of claim 1.

Sockets of this type are also known by the designation "Western socket" and are commonly used in communication and data technology. The interaction of the socket with a corresponding connector allows a releasable electrical connection to be established for the transmission of electrical signals. Increasingly higher transmission rates are being used for this, with the risk of an interfering electrical signal coupling occurring within the socket between pairs of conductors, with an adverse effect on the transmission quality. The signal coupling is both of a capacitive nature and of an inductive nature.

To keep such couplings down, it is proposed in U.S. Pat. No. 5,186,647 and U.S. Pat. No. 5,362,257 for certain conductors to cross over within the contact module. Complex conductor guides are used for this purpose, with the effect that production of the sockets involves considerable expense.

DE 199 38 367 A1 describes a socket in which eight conductors are arranged next to one another, a crossing region being provided by means of a circuit board laminated on both sides, which can be fixed to the contact module, in order that the conductors with the numbers 3 and 6 cross one another. For this purpose, these conductors must be interrupted before the double-sided circuit board is applied, and the circuit board must be inserted into a receptacle of the contact module. Such a configuration of the socket consequently also involves considerable production costs.

U.S. Pat. No. 6,089,923 and EP-A-0 982 815 disclose electrical sockets in which a housing surrounds a contact module which comprises a number of electrical conductors and contact elements, it being possible for the contact elements to be contacted by associated plug contacts of a connector. Two conductors respectively form a pair of conductors for the transmission of a high-frequency electrical signal. The contact module has a multi-layer electrical circuit board, into which the contact elements are inserted. The contact elements respectively form a contact spring by the end regions projecting beyond the circuit board and facing toward a space for the connector. The circuit board carries compensation capacitors for the capacitive coupling of conductors of different pairs of conductors. The circuit board also carries conductor tracks which form the electrical conductors of at least two pairs of conductors. In a first conductor track section, a first conductor track of the first pair of conductors is at a smaller distance from a first conductor track of the second pair of conductors than from the second conductor track of the second pair of conductors, and, in a second conductor track section, the first conductor track of the first pair of conductors is at a smaller distance from the second conductor track of the second pair of conductors than from the first conductor track of the second pair of conductors.

It is an object of the present invention to develop an electrical socket of the type stated at the beginning in such a way that it can be produced at low cost and the risk of signal coupling between different pairs of conductors is reduced.

SUMMARY OF THE INVENTION

This object is achieved by an electrical socket with the features of Patent claim 1.

The use of a multi-layer electrical circuit board in combination with contact elements which are inserted into the circuit board and form contact springs with their free end regions makes a compact configuration of the contact module possible. Insertion of the contact elements into the circuit board allows the end regions of the contact elements projecting beyond the circuit board in the form of the contact springs to be kept very short, so that on the one hand resilient contacting of the associated plug contacts of the connector is ensured, but on the other hand inductive and capacitive couplings between conductors of different pairs of conductors can be kept down.

The insertion of the contact elements in the circuit board also makes low-cost production of the electrical socket possible, since it is possible to dispense with an expensive soldered connection between the contact elements and the circuit board. In addition, production is simplified by the use of the multi-layer circuit board. A multi-layer circuit board is understood here as meaning a circuit board which has electrical conductor tracks in at least two planes, for example on its upper side facing toward the space for the connector and its underside, facing away from the space for the connector. Multi-layer circuit boards of this type are known to a person skilled in the art as "multi-layers".

To counteract capacitive coupling of conductors of different pairs of conductors in the region of the contact elements, the circuit board carries compensation capacitors for the capacitive coupling of conductors of different pairs of conductors. By means of the compensation capacitors, a capacitive counter-coupling is provided in the region of the circuit board, and can be used to help reduce the signal coupling between different pairs of conductors.

The socket according to the invention also has means for inductive counter-coupling. For this purpose, the path of the conductor tracks which form at least the conductors of two pairs of conductors is chosen such that an inductive coupling in the region of the contact elements and in the region of a first conductor track section is counteracted by a corresponding inductive coupling in a second conductor track section. Altogether, this can have the effect of reducing the inductive coupling between different pairs of conductors. While in a first conductor track section a first conductor track of a first pair of conductors has a stronger inductive coupling with respect to a first conductor track of the second pair of conductors than with respect to the second conductor track of the second pair of conductors, the inductive coupling in the second conductor track section is precisely reversed, i.e. in the second conductor track section the first conductor track of the first pair of conductors has a stronger inductive coupling with respect to the second conductor track of the second pair of conductors than with respect to the first conductor track of the second pair of conductors.

By the combined use of compensation capacitors disposed on the circuit board and a conductor track routing which permits inductive counter-coupling, the signal coupling between different pairs of conductors in the case of the electrical socket according to the invention can be kept very low. This makes it possible to use the socket according to the invention also for the transmission of very high-frequency signals.

According to the invention, the conductor tracks of the first and second pairs of conductors follow such a path that they intersect contactlessly at a common point of intersection. The four conductor tracks which form the first and second pairs of conductors are therefore brought together at a common point of intersection, at which they intersect contactlessly. In the region of the point of intersection, the four conductor tracks may altogether form a star-shaped path.

It is of advantage if the first conductor track section follows on directly from the contact springs.

To achieve particularly effective inductive counter-coupling, it is advantageous if the first conductor track section is shorter than the second conductor track section. In the first conductor track section, the spatial disposition of the conductor tracks corresponds substantially to the disposition of the contact elements which can be contacted by the associated plug contacts of the connector. An inductive coupling between conductors of different pairs of conductors takes place both in the region of the contact elements and in the region of the first conductor track section. To keep this inductive coupling as low as possible, it is advantageous to choose the length of the first conductor track section to be very small, while the length of the second conductor track section, in which an inductive counter-coupling takes place, is chosen to be greater.

A capacitive coupling between conductors of different pairs of conductors takes place not only in the region of the compensation capacitors and in the region of the contact elements but also in the region of the conductor tracks, although their capacitive coupling is less than the capacitive coupling which is achieved with the compensation capacitors. It has been found that particularly good inductive and capacitive counter-coupling can be achieved in the region of the circuit board if the conductor tracks of the first and second pairs of conductors in the second conductor track section are disposed at the corner points of an equal-sided quadrangle with respect to the cross-section of the multi-layer circuit board.

The circuit board is preferably of a four-layer configuration, the conductor tracks of the first and second pairs of conductors, at least in the second conductor track section, respectively running in one plane of the circuit board.

In the case of such an embodiment, the four conductor tracks which make up the first and second pairs of conductors are therefore respectively disposed in one plane of the four-layer circuit board, at least in the region of the second conductor track section.

In the case of a particularly preferred embodiment, the conductor tracks of the first and second pairs of conductors in the second conductor track section are disposed at the corner points of a square with respect to the cross-section of the circuit board. It has surprisingly been found that such a disposition of the conductor tracks in the region of the second conductor track section allows the inductive and capacitive signal coupling of the electrical socket to be kept particularly low.

In order to achieve the disposition according to the invention of the conductor tracks with the different distances explained above in the first and second conductor track sections in a way which is simple in terms of construction, it is advantageous if the conductor tracks of at least one pair of conductors intersect contactlessly between the first and second conductor track sections.

Particularly low signal coupling between conductors of different pairs of conductors is achieved by the conductor tracks of different pairs of conductors intersecting contactlessly at a single point of intersection. In the case of such a configuration, the path of the conductor tracks is chosen such that the conductor tracks of different pairs of conductors only have a single point of intersection, while otherwise at most conductor tracks of the same pair of conductors intersect contactlessly, but there is no further point of intersection of conductor tracks of different pairs of conductors.

The conductor tracks are preferably aligned parallel to one another in a region following on from the common point of intersection. It is of particular advantage in this respect if the conductor tracks in this parallel aligned region do not coincide but are disposed offset from one another.

As already explained, in the case of the electrical socket the contact elements are inserted into the circuit board. It has proven to be advantageous in this respect if the contact elements are pressed into the circuit board.

The contact elements preferably reach through the circuit board. As a result, the mechanical stability of the contact module is improved. Furthermore, this provides the possibility of connecting at least some of the contact elements on the underside of the circuit board, facing away from the space for the connector, to continuing connecting elements, so that these contact elements respectively form in the region of the circuit board an electrical conductor which is connected in one piece with the associated contact spring.

To give the contact elements the required mechanical stability on the one hand and to ensure on the other hand that the end regions of the contact elements projecting beyond the upper side of the circuit board, facing toward the space for the connector, do not undergo permanent deformation even in the case of a short spring length, it is of advantage if at least some of the contact elements are produced from a spring steel.

As already explained, the contact springs can be kept very short. It has proven to be particularly advantageous if the end regions of the contact elements projecting beyond the upper side of the circuit board, i.e. the contact springs, have a length of at most 4 mm, preferably a length of approximately 3 mm.

In the case of the electrical socket according to the invention, the circuit board carries a number of compensation capacitors. It has proven to be particularly advantageous in this respect if the compensation capacitors are respectively formed by two electrically conductive layer regions lying opposite each other, disposed in different planes of the multi-layer circuit board. The compensation capacitors are configured here in the form of plate capacitors, the capacitor plates respectively being formed by a conductive layer region of the multi-layer circuit board. This makes a particularly compact construction of the contact module possible, it being possible for interfering signal coupling to be kept very low. The capacitance of the compensation capacitors can be predetermined by the distance between the electrically conductive layer regions lying opposite each other and also by the size of the layer regions and the dielectric constant of the material of the circuit board.

It has been found that a particularly good transmission quality can be achieved if the compensation capacitors are disposed in the region of the circuit board directly adjacent the contact springs.

The risk of an interfering signal coupling between different pairs of conductors decreases as the distance between the pairs of conductors increases. The coupling of pairs of conductors disposed directly adjacent one another is therefore of particular importance. In the case of a preferred embodiment, it is therefore provided that each pair of conductors is coupled to the directly adjacent pair of conductors by means of at least one compensation capacitor. The interfering capacitive coupling of the pairs of conductors can be compensated at least partly by means of the compensation capacitors. This allows signal coupling at the data transmission rates that are used to be kept down by appropriate dimensioning of the compensation capacitors.

In the case of an advantageous embodiment, the circuit board is of a three-layer configuration, i.e. the circuit board carries conductor tracks which run in three spaced-apart planes. It is particularly advantageous if the planes in which the conductor tracks are disposed are positioned at different distances from one another. For example, an asymmetrically configured circuit board may be used in such a way that the circuit board carries electrical conductor tracks respectively on its upper side and on its underside and that conductor tracks additionally run in an intermediate plane, the intermediate plane being at different distances from the upper side and the underside.

The use of a circuit board with a number of planes disposed at different distances from one another makes it possible in particular to choose a comparatively great spacing for the conductor tracks contactlessly intersecting one another, while the spacing of the electrically conducting layer regions which respectively form a capacitor plate can be chosen to be smaller.

In the case of a three-layer circuit board, it has proven to be advantageous if the distance of the intermediate plane from the upper side is approximately one quarter to one third of the total thickness of the circuit board.

As already explained, in the case of an advantageous embodiment a four-layer circuit board is used. It is advantageous in this respect if the two middle planes are spaced apart by approximately twice the distance that they are from the respectively directly adjacent outer plane, that is the upper side or underside of the circuit board.

In the case of a particularly preferred embodiment of the electrical socket, the circuit board carries on its underside, facing away from the space for the connector, a number of pairs of terminal elements, which are respectively associated with a pair of conductors, the pairs of terminal elements being positioned at a distance from one another. The terminal elements may be aligned perpendicularly in relation to the underside of the circuit board, but an oblique alignment, for example at an angle of 45° or 60° in relation to the underside of the circuit board, may also be used. The spaced-apart terminal elements simplify the connection of continuing connecting elements to the circuit board. For example, it may be provided that the terminal elements respectively form a contact. The terminal elements may in this case be spaced apart from one another by a greater distance than the contact springs disposed on the front side of the circuit board.

The use of a circuit board with contact springs disposed on the upper side and terminal elements disposed on the underside makes it possible in particular to configure the contact module as a decoupling element which has all the components for the inductive and capacitive counter-coupling of the pairs of conductors, that is in particular compensation capacitors and conductor track sections with transposed spacings of the conductor tracks of different pairs of conductors, so that no further electrical elements in addition to the contact module have to be used to compensate for interfering electrical signal coupling.

In the case of an embodiment which can be produced at particularly low cost, the terminal elements are inserted, preferably pressed, into the circuit board.

It is advantageous if the terminal elements and the contact elements are formed as contact pins pressed into the circuit board, some contact pins projecting beyond the upper side, facing toward the space for the connector, and forming the contact springs, and some contact pins projecting beyond the underside of the circuit board, facing away from the space for the connector, and forming contacts for the connection of connecting elements. The contact pins may, for example, take the form of punched contact strips and be pressed into the circuit board provided with through-bores. Subsequently, projecting end regions of the contact pins may either be detached, or else they are bent away in the region of the upper side of the circuit board and form contact springs, and projecting contact pins in the region of the underside of the circuit board may form contacts for the connection of connecting elements. The projection of the contact pins on the underside may be aligned perpendicularly in relation to the underside of the circuit board; if required, the projection may also be angled away, for example at an angle of 45° in relation to the underside of the circuit board. This provides the possibility of producing electrical sockets with differing alignment of the space for the connector with respect to the mounting side of the sockets, it being possible to use for the sockets contact modules which differ only in the alignment of the projections of the contact pins on the underside but are otherwise of an identical construction.

The contact pins projecting beyond the upper side of the circuit board preferably form a contact configuration with eight contact springs disposed next to one another. The use of eight contact springs disposed next to one another has proven successful in the case of telephone connections. For reasons of cost-effectiveness, expediency and standardization, this configuration has also been used for the transmission of data at higher data transmission rates, and it is intended to use such contact configurations also for data transmission rates of over 100 Mb/s. According to an international standard (ANSI/EIA/TIA-578-1991), the individual contact springs are associated with the conductors in such a way that the two outer contact springs on either side of the contact configuration are associated with one pair of conductors, that the two middle contact springs are associated with the contact configuration of a further pair of conductors, and that the contact springs respectively disposed between two outer contact springs and the two middle contact springs are associated with a further pair of conductors for the transmission of a high-frequency electrical signal.

The contact pins projecting beyond the underside of the circuit board preferably form a terminal configuration with four spaced-apart pairs of contacts, to which for example continuing connecting elements can be soldered. The four pairs may in this case be disposed at the corner points of a rectangle, so that they are very easily accessible for connecting the circuit board to continuing connecting elements, for example to further circuit boards or else to subscriber lines. The great spatial distance between the pairs of contacts has the effect of largely avoiding parasitic couplings between them.

The following description of preferred embodiments of the invention serves for a more detailed explanation in connection with the drawings.

BRIEF DESCRIPTION OF THE DRAWINGS

FIG. 1 shows a perspective representation of an electrical socket according to the invention as provided by a first embodiment;

FIG. 2 shows a sectional view of the electrical socket from FIG. 1;

FIG. 3 shows a view obliquely from above of the contact module of the socket from FIG. 1;

FIG. 4 shows a view obliquely from below of the contact module of the socket from FIG. 1;

FIG. 7 shows a sectional view of a second embodiment of a circuit board of the contact module along the line 7—7 in FIG. 8;

FIG. 8 shows a representation of the disposition of the conductor tracks of the circuit board from FIG. 7;

DETAILED DESCRIPTION OF THE INVENTION

Figure 5:
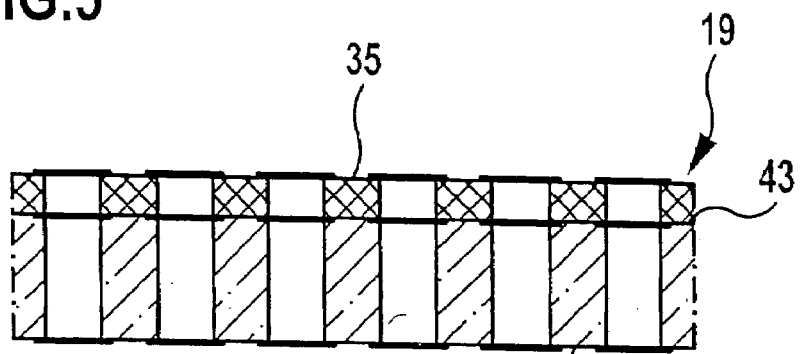
FIG. 5 shows a partial sectional view of a first embodiment of a circuit board of the contact module.

In FIGS. 1 to 6, a first embodiment of an electrical socket of a modular construction is schematically represented and is designated as a whole by the reference numeral 10, with a housing 11, which has a front side 13 which is aligned at an angle of 45° in relation to a mounting side 12 and into which there enters a space 14 for receiving an electrical connector associated with the socket 10. Connectors of this type are known and are therefore not represented in the drawing. Formed onto the housing 11 on the mounting side 12 are a number of latching elements, with the aid of which the socket 10 can be latched onto a carrier.

The housing 11 comprises a mounting space 15, which enters the mounting side 12 and into which a contact module 17 is inserted.

As FIGS. 3 and 4 reveal particularly clearly, the contact module 17 comprises a circuit board 19. Pressed into through-bores of the circuit board 19 that are explained in more detail below are a total of 14 contact pins 20 to 33, which respectively reach through the circuit board 19. The contact pins 20 to 29 are disposed in a row next to one another, eight contact pins, that is the contact pins 21 to 28, protruding beyond the upper side 35 of the circuit board 19 facing toward the space 14 for the connector and forming contact elements with projecting end regions in the form of contact springs 37 aligned obliquely in relation to the upper side 35, which can in each case be contacted by an associated plug contact of the connector (not represented in the drawing) when the connector is introduced into the space for the connector.

Of the contact pins 20 to 29 disposed in a row next to one another, the contact pins 20, 22 and also 27 and 29 project clearly beyond the underside 39 of the circuit board 19, facing away from the space 14 for the connector, and the contact pins 30, 31 and 32, 33 also project clearly beyond the underside 39. With their projecting end regions, these contact pins respectively form on the underside 39 of the circuit board 19 a terminal element with a contact 41, to which, for example, a continuing connecting element can be soldered.

A further connection possibility would be, for example, for the contacts 41 to be pressed into a circuit board.

The contact pins 21 to 28 respectively forming a contact spring 37 are produced from spring steel, so that the contact springs 37 can be resiliently bent for the contacting of the connector. The remaining contact pins 20, 29 and also 30 to 33 may likewise be produced from spring steel or else from some other electrically conductive material.

The circuit board 19 is configured with multiple layers as a so-called asymmetrical multi-layer. This is particularly clear from FIG. 5. It carries electrical conductor tracks on its upper side 35 and also on its underside 39 and, in addition, in an intermediate layer 43. The distance of the intermediate layer 43 from the upper side 35 is considerably less than the distance which the intermediate layer 43 is from the underside 39, to be precise the distance from the upper side is preferably approximately 0.36 mm, while the distance from the underside is about 1.14 mm. The total thickness of the circuit board 19 is consequently about 1.5 mm.

Figure 6:
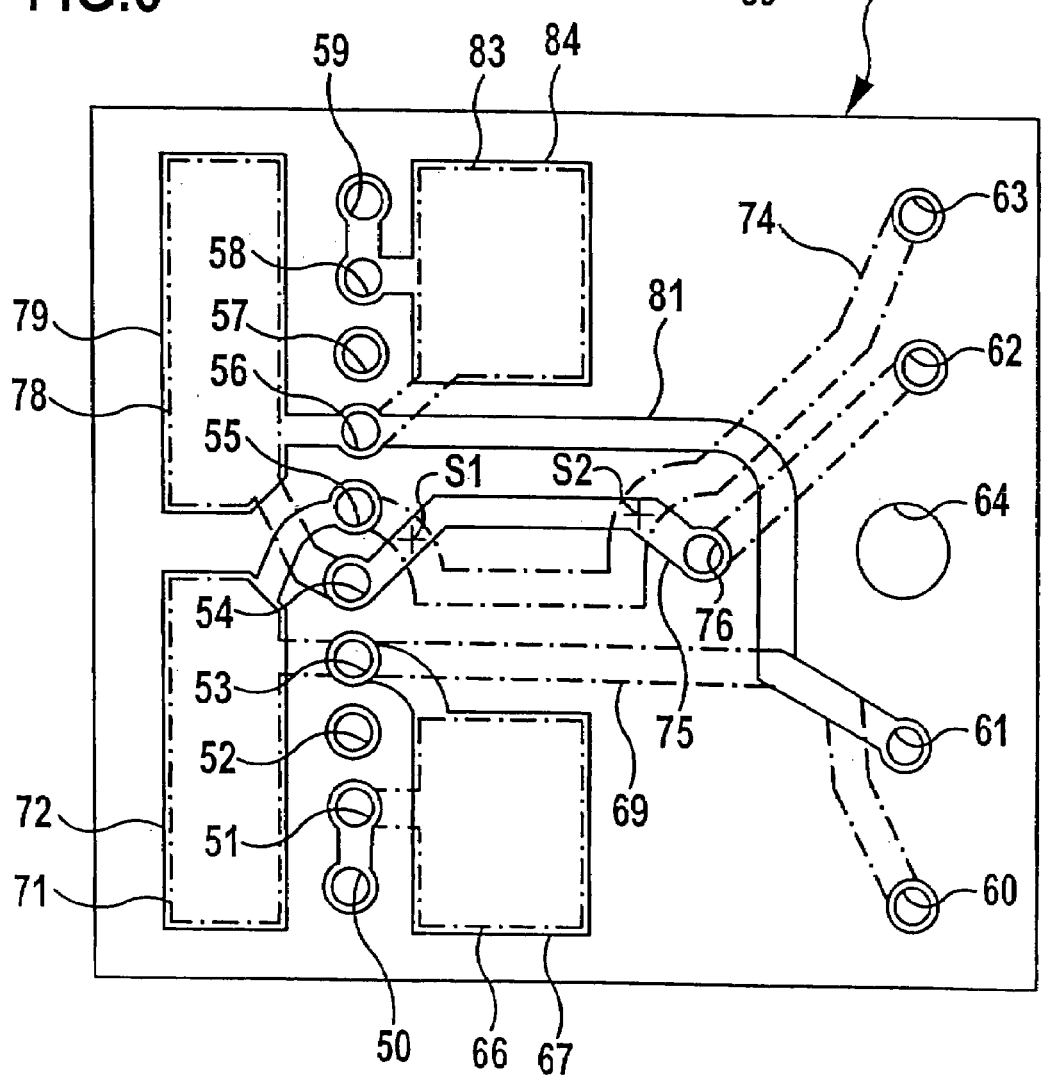
FIG. 6 shows a representation of the disposition of the conductor tracks of the circuit board from FIG. 5.

The path of the conductor tracks of the circuit board 19 is clear from the layout represented in FIG. 6. In FIG. 6, conductor tracks which run along the upper side 35 of the circuit board 19 are represented by solid lines, while conductor tracks which run in the intermediate layer 43 or along the underside 39 are represented in FIG. 6 by dash-dotted lines. The circuit board 19 has through-bores 50 to 59, which are disposed in a row next to one another and respectively receive a contact pin 20 to 29. In addition, the circuit board 19 comprises through-bores 60 to 63, which receive the contact pins 30 to 33. All the through-bores 50 to 63 are respectively provided with electrically conductive sleeves, which are known per se, are not represented in the drawing and once again receive the contact pins 20 to 33. Furthermore, the circuit board 19 has a position-securing bore 64 passing through it.

The through-bore 50 is connected by means of a conductor track disposed on the upper side 35 of the circuit board 19 to the adjacent through-bore 51, from which a conductor track extends within the intermediate layer 43 to an electrically conductive layer region disposed in the intermediate layer 43 in the form of a capacitor area 66. Disposed above the capacitor area 66, of a rectangular configuration, on the upper side 35 of the circuit board 19 is a correspondingly formed layer region in the form of a capacitor area 67, which is in connection with the through-bore 53 by means of a conductor track. The two capacitor areas 66 and 67 form a compensation capacitor.

From the through-bore 53, a conductor track 69 runs on the underside 39 of the circuit board 19 to the through-bore 60, and furthermore the through-bore 53 is electrically connected to a capacitor area 71 disposed in the intermediate layer 43. A capacitor area 72, which is disposed on the upper side 35 and is connected to the through-bore 55 by means of a conductor track, is associated with the capacitor area 71.

From the through-bore 55 there extends on the underside 39 a conductor track 74, by means of which the through-bore 55 is in electrical connection with the through-bore 63. The conductor track 74 is intersected twice by a conductor track 75, which establishes a connection between the through-bore 54 and the through-bore 62. A first piece of the conductor track 75 runs on the upper side 35, while a second piece, which is connected to the first piece by means of a contacting 76 is disposed on the underside 39. The through-bore 54 is additionally connected by means of a conductor track to a capacitor area 78, which is disposed in the intermediate layer 43 and associated with which on the upper side 35 of the circuit board 19 is a corresponding capacitor area 79, which is in electrical connection with the through-bore 56. The through-bore 56 is connected to the through-bore 61 by means of a conductor track 81. The conductor track 81 runs on the upper side 35 of the circuit board 19 and intersects the conductor tracks 74 and 69 disposed on the underside and also the second piece of the conductor track 75, likewise disposed on the underside 39 of the circuit board 19.

The through-bore 56 is also in electrical connection with a capacitor area 83, which is disposed in the intermediate layer 43 and associated with which is a capacitor area 84 on the upper side 35, which is connected to the through-bore 58. The through-bore 58 is additionally connected to the through-bore 59 by means of a conductor track.

As already mentioned, the capacitor areas 66, 67, disposed one above the other, and also the capacitor areas 71, 72 and 78, 79 as well as 83, 84 respectively form a compensation capacitor, with the aid of which it is possible to compensate for interfering capacitive couplings between the contact springs 37.

In accordance with the international standard already mentioned, the two through-bores 54 and 55 disposed in the middle of the row of through-bores 50 to 59 are associated with a first pair of conductors for the transmission of high-frequency electrical signals. The directly adjacently disposed through-bores 53 and 56 are associated with a second pair of conductors, and the two through-bores 51, 52 and 57, 58 respectively lying on the outside are respectively associated with a further pair of conductors. Accordingly, the pair of conductors corresponding to the through-bores 57 and 58 are coupled by means of the compensation capacitor formed by the capacitor areas 83 and 84 to the pair of conductors which are associated with the through-bores 53 and 56. Coupled to the last-mentioned pair of conductors, by means of the compensation capacitor formed by the capacitor areas 66 and 67, is also the pair of conductors corresponding to the through-bores 51 and 52. To account for the capacitive coupling between the pair of conductors corresponding to the through-bores 53 and 56 and the pair of conductors corresponding to the two middle through-bores 54 and 55, the compensation capacitors which are formed by the capacitor areas 71, 72 and 78, 79 are respectively used.

As already mentioned, the conductor track 74 is intersected twice by the conductor track 75, to be precise at a first point of intersection S1, which is disposed directly adjacent the through-bores 54, 55, and at a second point of intersection S2, which is positioned at a distance from the first point of intersection S1. The conductor tracks 74 and 75 form a first pair of conductors, which connect the through-bores 54, 55, which respectively receive the contact pins 24 and 25, to the through-bores 62 and 63, into which the contact pins 32 and 33 are respectively inserted. The directly adjacently disposed conductor tracks 69 and 81 form a second pair of conductors, by means of which the through-bores 53 and 56 are in connection with the through-bores 60 and 61, respectively. The intersecting of the conductor tracks 74 and 75 at the point of intersection S1 has the effect of changing the relative position of these two conductor tracks in relation to the adjacent conductor tracks 69 and 81 in such a way that, in a first conductor track section which extends between the through-bore 55 and the point of intersection S1, the conductor track 74 is at a smaller distance from the conductor track 81 than from the conductor track 69, while in a second conductor track section, which extends from the point of intersection S1 to the point of intersection S2, the distance of the conductor track 74 from the conductor track 69 is less than from the conductor track 81. The same applies correspondingly to the conductor track 75, which in the first conductor track section, that is in the region between the through-bore 54 and the point of intersection S1, is at a smaller distance from the conductor track 69 than from the conductor track 81, while in the second conductor track section, i.e. between the two points of intersection S1 and S2, it is at a smaller distance from the conductor track 81 than from the conductor track 69. Since the inductive coupling between the pairs of conductors 74, 75 and 69, 81 is dependent on the distance of the conductor tracks 74, 75, which form a first pair of conductors, from the conductor tracks 69, 81, which form a second pair of conductors, an inductive counter-coupling is achieved by the transposed disposition of the two conductor tracks 74, 75 in the second conductor track section in comparison with the disposition which they assume in the first conductor track section, in such a way that the inductive coupling of the conductors of the first pair of conductors 74, 75 in relation to the conductors of the second pair of conductors 69, 81 occurring in the region of the contact pins 24, 25 and in the region of the first conductor track section is largely compensated by an inductive counter-coupling in the region of the second conductor track section.

The tapping of the electrical signals which are supplied to the socket 10 via the connector (not represented in the drawing) takes place from the underside 39 of the circuit board 19. Two contacts 41 disposed directly adjacent each other respectively form a pair of terminals here, which are associated with the pairs of conductors mentioned above. The pairs of terminals are disposed at a distance from one another at the corner points of a rectangle. This is particularly clear from FIG. 4. It is also evident from FIGS. 3 and 4 that the distance between the contact springs 37 respectively contacting a plug contact of the connector is made to be relatively small, while the distance between the contacts 41 is chosen to be. greater, so that the contacts 41 are easily accessible for the connection of continuing connecting elements.

It is clear from the above that the contact module 17 forms with the circuit board 19 and the contact pins 20 to 33 an inductive and capacitive decoupling element which can be contacted by the connector and carries on its underside, facing away from the space 14 for the connector, contacts 41 disposed in pairs, one pair of contacts respectively corresponding to one pair of conductors for the transmission of high-frequency electrical signals.

In FIGS. 7 and 8, a second embodiment of a circuit board is represented and is designated as a whole by the reference numeral 119. This is of a configuration similar to that of the circuit board 19. Therefore, the same reference numerals as in FIG. 6 are used in FIG. 8 for identical or equivalent components and, to avoid repetition, reference is made to the explanations given above in their entirety with respect to these components.

The circuit board 119 is formed with four layers and comprises an upper layer 121, a lower layer 122 and also an upper intermediate layer 123 and a lower intermediate layer 124. The distance here between the two intermediate layers 123, 124 is approximately twice the distance of the intermediate layers 123, 124 from the respectively directly adjacent upper layer 121 or lower layer 122. For instance, the distance between the two intermediate layers is preferably about 0.71 mm, while the distance of each intermediate layer 123, 124 from the respectively directly adjacent upper layer or lower layer is about 0.36 mm.

The circuit board 119 likewise has the through-bores 50 to 59 already explained above with reference to FIG. 6, which are disposed in a row next to one another and respectively receive a contact pin 20 to 29. Furthermore, the circuit board 119 also comprises through-bores 60 to 63, which receive the contact pins 30 to 33. Once again, the through-bores 50 to 63 are respectively provided with sleeves (not represented in the drawing), which once again receive the said contact pins 20 to 33. A position-securing bore 64 is also used for the circuit board 119, passing through it.

The circuit board 119 likewise carries the capacitor areas 66, 67 and also 71, 72 and 78, 79 and also 83, 84, which have already been explained in detail and respectively form a compensation capacitor for the capacitive counter-coupling. The capacitor areas 66, 72, 79 and 83 are disposed on the upper layer 121 of the four-layer circuit board 119, while the respectively associated capacitor areas 67, 71, 78 and 84 are disposed on the upper intermediate layer 123. The electrical connection of the capacitor areas to the respective through-bores is identical to the corresponding connections in the case of the circuit board 19. To avoid repetition, reference is made in this respect to the foregoing explanations.

The circuit board 119 differs essentially from the circuit board 19 in that the conductor tracks by means of which the through-bores 53, 54, 55 and 56 are respectively in electrical connection with the through-bores 60, 63, 62 and 61 follow a different path. In FIG. 8, the conductor tracks running on the upper side 121 are represented by solid lines, the conductor tracks running on the upper intermediate layer 123 are represented by dashed lines, the conductor tracks running on the lower intermediate layer 124 are represented by dashed-dotted lines and the conductor tracks running on the lower layer 122 are represented by dash-double-dotted lines. The through-bore 53 is in electrical connection with the through-bore 60 by means of a conductor track 169, and the through-bore 56 is connected to the through-bore 61 by means of a conductor track 181. As already explained above with reference to FIG. 6 in connection with the conductor tracks 69 and 81, these two conductor tracks 169 and 181 form in a corresponding way a pair of conductors for the transmission of a high-frequency electrical signal.

The through-bore 54 is in electrical connection with the through-bore 63 by means of a conductor track 174, and the through-bore 55 is connected to the through-bore 62 by means of a conductor track 175. The conductor tracks 174 and 175 likewise form a pair of conductors for the transmission of a high-frequency electrical signal. The conductor tracks 169, 181, 174, 175 respectively run in one plane of the circuit board 119, to be precise the conductor track 169 runs on the upper intermediate layer 123, the conductor track 181 runs on the lower layer 122, the conductor track 174 runs on the lower intermediate layer 124, and the conductor track 175 runs on the upper layer 121. This is particularly clear from FIG. 7.

As evident from FIG. 8, the conductor tracks 169, 181, 174 and 175, extending from the respective through-bores 53, 56, 54 and 55, are brought together at a single common point of intersection S, at which they intersect contactlessly. The short region between the respective through-bores and the point of intersection S forms a first conductor track section. Following on from the point of intersection S is a second conductor track section, in which the conductor tracks 169, 181, 174 and 175 are aligned parallel to one another. Following on from the second conductor track section, adjacent the through-bores 60 to 63, is a third conductor track section, in which the conductor tracks respectively forming a pair of conductors, 169 and 181 and also 174 and 175, respectively overlap in pairs, the different pairs of conductors 169, 181 on the one hand and 174, 175 on the other hand being at a clear distance from one another.

As already explained with reference to FIG. 6, the capacitor areas 66, 67; 71, 72; 78, 79; 83, 84 disposed on the circuit board 119 respectively provide a compensation capacitor, with the aid of which it is possible to counteract a capacitive coupling between conductors of different pairs of conductors occurring in the region of the contact springs 37. An inductive counter-coupling between the first pair of conductors, which are associated with the through-bores 54, 55, and the second pair of conductors, which are associated with the through-bores 53 and 56, is achieved by the disposition of the conductor tracks 169, 181 and 174, 175 in first and second conductor track sections, as already explained above with reference to the conductor tracks 69, 74, 75 and 81. Once again, the path of the conductor tracks is chosen such that, in the first conductor track section, i.e. in the region between the through-bores 53 to 56 and the point of intersection S, the distance of a first conductor track of the first pair of conductors 174, 175 from a first conductor track of the second pair of conductors 169, 181 is less than the distance at which the respective conductor track in the second conductor track section is from the corresponding conductor track of the second pair of conductors. For instance, in the first conductor track section, the distance of the conductor track 174 from the conductor track 169 is less than from the conductor track 181, while in the second conductor track section the distance of the conductor track 174 from the conductor track 181 is less than from the conductor track 169. This is particularly clear from FIG. 7. The same applies correspondingly to the conductor track 175, which in the first conductor track section is at a smaller distance from the conductor track 181 than from the conductor track 169, while in the second conductor track section it is at a smaller distance from the conductor track 169 than from the conductor track 181. The resultant reversal of the spacings of the conductor tracks of different pairs of conductors in the first and second conductor track sections achieves an effective inductive counter-coupling, so that altogether the signal coupling that is unavoidable in the region of the contact springs 37 can be effectively compensated.

As is clear from FIG. 7, in the region of the second conductor track section the conductor tracks 174, 175, 169 and 181 are disposed with respect to the cross-section of the circuit board 119 at the corner points of a square. As a result, the shortest distance of a conductor track from an adjacent conductor track corresponds to a side length of the square. For example, the distance of the conductor track 175 from the conductor track 169 in the region of the second conductor track section is less than the distance assumed by the conductor track 175 in this region from the conductor track 181. This is immediately clear from FIG. 7. It has been found that particularly low signal coupling can be ensured by such a disposition.

The terminals of the circuit board 119 are identical to the terminals of the circuit board 19. Consequently, the contact module 17 may be configured optionally with the circuit board 19 or with the circuit board 119.

Figure 9:
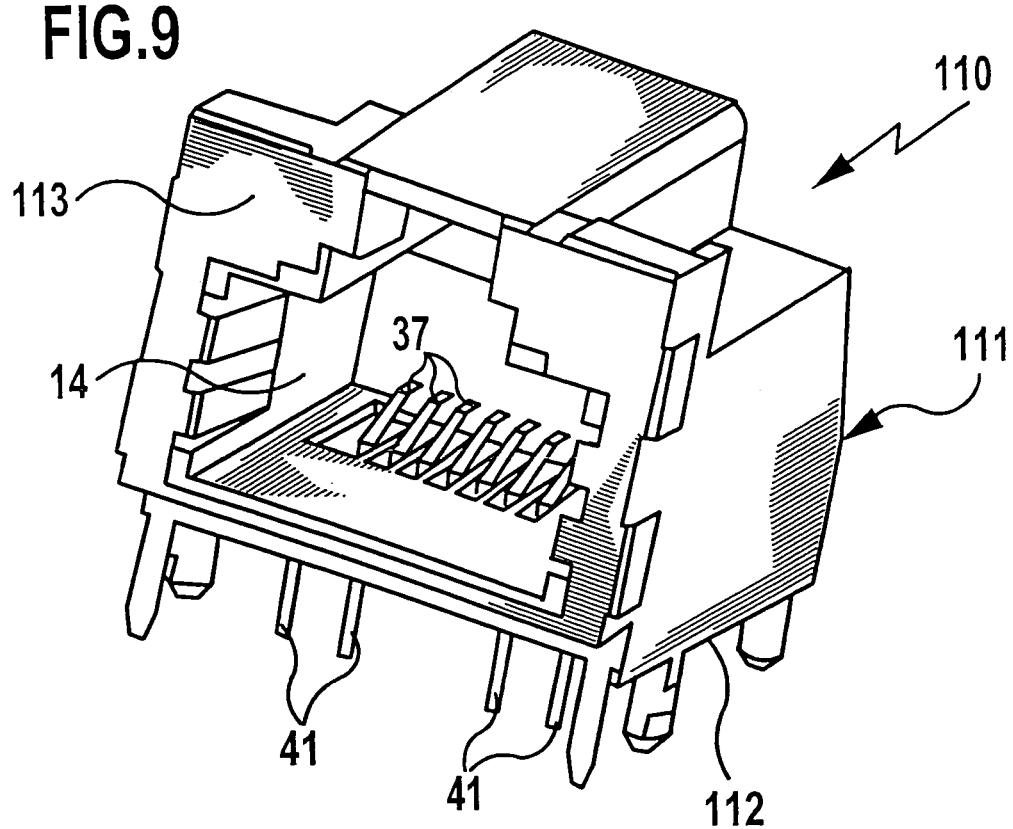
FIG. 9 shows a perspective representation of an electrical socket according to the invention as provided by a further embodiment and FIG. 10 shows a sectional view of the electrical socket from FIG. 9.
Figure 10:
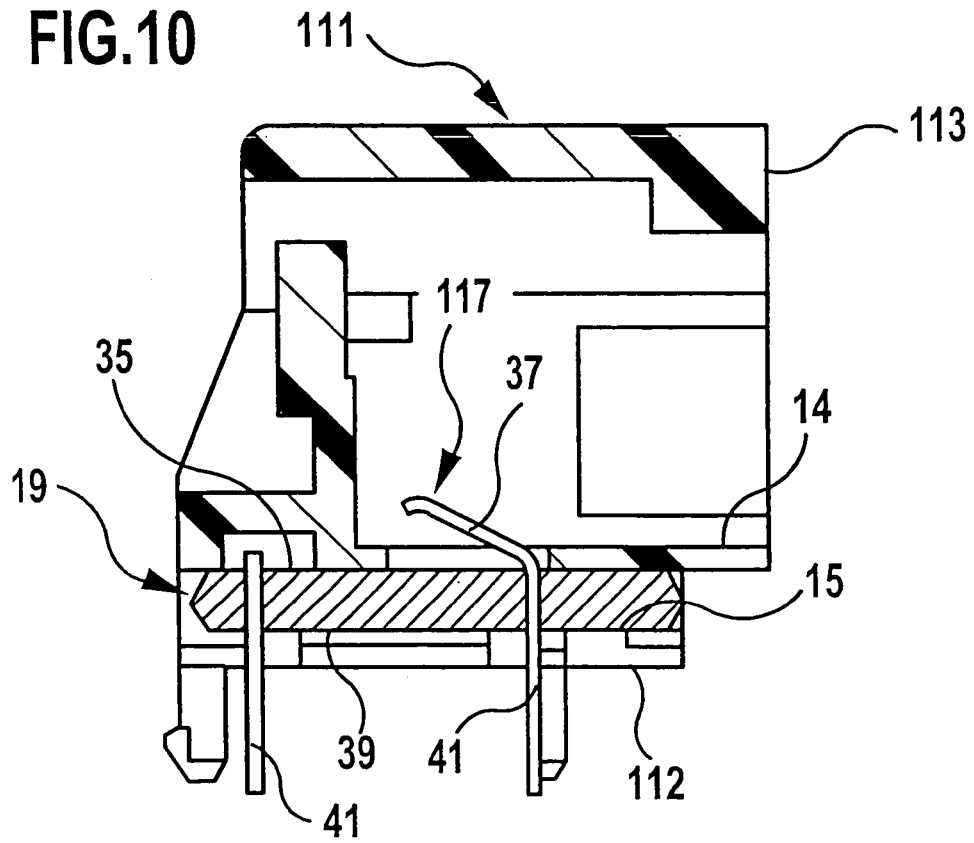

In FIGS. 9 and 10, a further embodiment of a socket according to the invention is schematically represented and is designated as a whole by the reference numeral 110. It comprises a housing 111, the front side 113 of which is aligned perpendicularly in relation to its mounting side 112. Otherwise, the socket 110 has the same construction as the socket 10 explained above, so that the same reference numerals as in FIGS. 1 to 6 are used for identical components. To avoid repetition, reference is made to the explanations given above in their entirety in this respect.

The housing 111 of the socket 110 also has on the mounting side a mounting space 15, into which a contact module 117 is inserted. This module is of a construction which is largely identical to that of the already explained contact module 17 and differs from the latter only in that the terminal elements protruding on the underside from the circuit board 19 of the contact module 117 in the form of the contacts 41 are aligned perpendicularly in relation to the underside of the circuit board 19, while in the case of the contact module 17 of the socket 10 they are aligned at an angle of 45° in relation to the underside 39. It is alternatively also possible in the case of the contact module 117 for the circuit board 119 to be used instead of the circuit board 19.

Therefore, the same contact modules 17 can be used for the production of the socket 110 as are also used in the case of the socket 10, just without the final mounting step of the contact module 17, that is the angling away of the contacts 41 protruding on the underside from the circuit board 19 or 119, so that they retain unchanged the alignment assumed during pressing into the corresponding through-bores of the circuit board 19 or 119. As a result, production costs for the sockets 10 and 110 can be reduced by a not inconsiderable amount.

The invention claimed is:

1. Electrical socket with a housing, which has a space for inserting a connector and surrounds a contact module, the contact module comprising a number of electrical conductors and contact elements which can be contacted by associated plug contacts of the connector, two conductors respectively forming a pair of conductors for the transmission of a high-frequency electrical signal and at least two conductors intersecting, the contact module comprising a multi-layer electrical circuit board and the contact elements being inserted into the circuit board and respectively forming a contact spring by their end regions projecting beyond the circuit board and facing toward the space for the connector, and the circuit board carrying compensation capacitors for the capacitive coupling of conductors of different pairs of conductors, and the circuit board carrying conductor tracks which form the electrical conductors of at least two pairs of conductors in such a way that, in a first conductor track section, a first conductor track of a first pair of conductors is at a smaller distance from a first conductor track of the second pair of conductors than from the second conductor track of the second pair of conductors, whereas, in a second conductor track section, the first conductor track of the first pair of conductors is at a smaller distance from the second conductor track of the second pair of conductors than from the first conductor track of the second pair of conductors, wherein the conductor tracks of the first and second pairs of conductors intersect contactlessly at a common point of intersection, wherein the conductor tracks of the first and second pairs of conductors are aligned mirror-symmetrically in relation to one another.

2. Electrical socket according to claim 1, wherein the first conductor track section is connected to the contact springs.

3. Electrical socket according to claim 1, wherein the first conductor track section is shorter than the second conductor track section.

4. Electrical socket according to claim 1, wherein the conductor tracks of the first and second pairs of conductors in the second conductor track section are disposed at the corner points of an equal-sided quadrangle with respect to the cross-section of the circuit board.

5. Electrical socket according to claim 1, wherein the conductor tracks of at least one pair of conductors intersect contactlessly between the first and second conductor track sections.

6. Electrical socket according to claim 1, wherein the conductor tracks of different pairs of conductors intersect contactlessly at a single point of intersection.

7. Electrical socket according to claim 1, wherein in the second conductor track section, the conductor tracks are aligned parallel to one another.

8. Electrical socket according to claim 1, wherein the contact elements are pressed into the circuit board.

9. Electrical socket according to claim 1, wherein the contact elements reach through the circuit board.

10. Electrical socket according to claim 1, wherein at least some of the contact elements are produced from spring steel.

11. Electrical socket according to claim 1, wherein the compensation capacitors are respectively formed by two electrically conductive layer regions lying opposite each other, disposed in different planes of the circuit board.

12. Electrical socket according to claim 1, wherein the compensation capacitors are disposed in the region of the circuit board directly adjacent the contact springs.

13. Electrical socket according to claim 1, wherein each pair of conductors is coupled to the directly adjacent pair of conductors by means of at least one compensation capacitor.

14. Electrical socket according to claim 1, wherein the circuit board is of a four-layer configuration, the conductor tracks of the first and second pairs of conductors in the second conductor track section respectively running in one plane of the circuit board.

15. Electrical socket according to claim 14, wherein the conductor tracks of the first and second pairs of conductors in the second conductor track section are disposed at the corner points of a square with respect to the cross-section of the circuit board.

16. Electrical socket according to claim 1, wherein the circuit board is of a three-layer configuration.

17. Electrical socket according to claim 16, wherein the circuit board is asymmetrically configured.

18. Electrical socket according to claim 1, wherein the circuit board carries on its underside, facing away from the space for the connector, a number of pairs of terminal elements, which are respectively associated with a pair of conductors, the pairs of terminal elements being disposed at a distance from one another.

19. Electrical socket according to claim 18, wherein the terminal elements are aligned perpendicularly in relation to the underside of the circuit board.

20. Electrical socket according to claim 18, wherein the terminal elements are aligned obliquely in relation to the underside of the circuit board.

21. Electrical socket according to claim 18, wherein the terminal elements are inserted into the circuit board.

22. Electrical socket according to claim 18, wherein the terminal elements and the contact elements are formed as contact pins pressed into the circuit board, some contact pins projecting beyond the upper side, facing toward the space for the connector, and forming the contact springs, and some contact pins projecting beyond the underside of the circuit board, facing away from the space for the connector, and forming contacts for the connection of connecting elements.

23. Electrical socket according to claim 22, wherein the contact pins projecting beyond the upper side of the circuit board form a contact configuration with eight contact springs disposed next to one another.

24. Electrical socket according to claim 22, wherein the contact pins projecting beyond the underside of the circuit board form a terminal configuration with four spaced-apart pairs of contacts.

* * * * *